United States Patent
Kannala et al.

(10) Patent No.: US 9,639,516 B2
(45) Date of Patent: May 2, 2017

(54) SYSTEM AND METHOD FOR EXPRESS SPREADSHEET VISUALIZATION FOR BUILDING INFORMATION MODELING

(71) Applicant: Solibri, Inc., Helsinki (FI)

(72) Inventors: Matti Juhani Kannala, Espoo (FI);
Anne Helena Urrila, Helsinki (FI);
Heikki Antero Kulusjarvi, Espoo (FI);
Pasi Tuomo Paasiala, Helsinki (FI);
Anupam Arohi, Espoo (FI)

(73) Assignee: Solibri, Inc., Helsinki (FI)

( * ) Notice: Subject to any disclaimer, the term of this patent is extended or adjusted under 35 U.S.C. 154(b) by 412 days.

(21) Appl. No.: 14/073,434

(22) Filed: Nov. 6, 2013

(65) Prior Publication Data

US 2014/0129912 A1 May 8, 2014

Related U.S. Application Data

(60) Provisional application No. 61/724,143, filed on Nov. 8, 2012.

(51) Int. Cl.
| | | |
|---|---|---|
| *G06F 17/22* | (2006.01) | |
| *G06F 17/24* | (2006.01) | |
| *G06F 17/30* | (2006.01) | |
| *G06F 17/50* | (2006.01) | |
| *G06F 3/0481* | (2013.01) | |
| *G06N 5/00* | (2006.01) | |

(52) U.S. Cl.
CPC ........ *G06F 17/246* (2013.01); *G06F 3/04815* (2013.01); *G06F 17/30174* (2013.01); *G06F 17/5004* (2013.01); *G06N 5/00* (2013.01)

(58) Field of Classification Search
CPC ............... G06F 17/246; G06F 3/04815; G06F 17/5004; G06F 17/30174; G06N 5/00
See application file for complete search history.

(56) References Cited

U.S. PATENT DOCUMENTS

| 8,427,473 B2 * | 4/2013 | Elsberg ................. G06T 15/005 345/419 |
| 8,732,125 B2 * | 5/2014 | Omansky ............ G06F 17/5004 707/621 |
| 9,342,928 B2 * | 5/2016 | Rasane ................. G06T 19/006 |
| 2006/0044307 A1 * | 3/2006 | Song ...................... G06Q 10/06 345/419 |

(Continued)

OTHER PUBLICATIONS

V. Singh et al. "A Theoretical Framework of a BIM-Based Multi-Disciplinary Collaboration Platform," vol. 20, No. 2, Mar. 2011, pp. 134-144.*

(Continued)

*Primary Examiner* — Maikhanh Nguyen
(74) *Attorney, Agent, or Firm* — Smith Gambrell & Russell LLP

(57) ABSTRACT

An express spreadsheet visualization system configured to simultaneously display, update, and synchronize BIM model representations across spreadsheet applications and visualization handling applications. The express spreadsheet visualization system provides a synchronizing mechanism between the two representations. Users get the benefit of complete information in one place. Updates made to pertinent parts in a BIM model in either representation (visual or spreadsheet) are automatically reflected in the associated representation.

12 Claims, 15 Drawing Sheets

(56) References Cited

U.S. PATENT DOCUMENTS

| | | | | |
|---|---|---|---|---|
| 2008/0012863 | A1* | 1/2008 | Finn | G06T 13/20 |
| | | | | 345/473 |
| 2008/0015823 | A1* | 1/2008 | Arnold | G06F 8/20 |
| | | | | 703/1 |
| 2009/0125283 | A1* | 5/2009 | Conover | G06Q 10/10 |
| | | | | 703/1 |
| 2010/0110071 | A1* | 5/2010 | Elsberg | G06T 15/005 |
| | | | | 345/419 |
| 2012/0066178 | A1* | 3/2012 | Omansky | G06F 17/5004 |
| | | | | 707/626 |
| 2012/0203806 | A1* | 8/2012 | Panushev | G06Q 50/08 |
| | | | | 707/825 |
| 2013/0169681 | A1* | 7/2013 | Rasane | G06Q 50/10 |
| | | | | 345/633 |
| 2013/0257850 | A1* | 10/2013 | Chen | G06T 19/20 |
| | | | | 345/419 |

OTHER PUBLICATIONS

Solibri Magazine 2012 (28 pages), "Validating the Process" found on p. 17.
Solibri Magazine 2013 (32 pages), all pages.
Solibri Model Checker V9 "The Software that will Revolutionize How we Design, Construct and Maintain Buildings" found at: www.solibri.com/products/solibri-model-checker; 8 pgs.

\* cited by examiner

FIG. 2
(Prior Art)

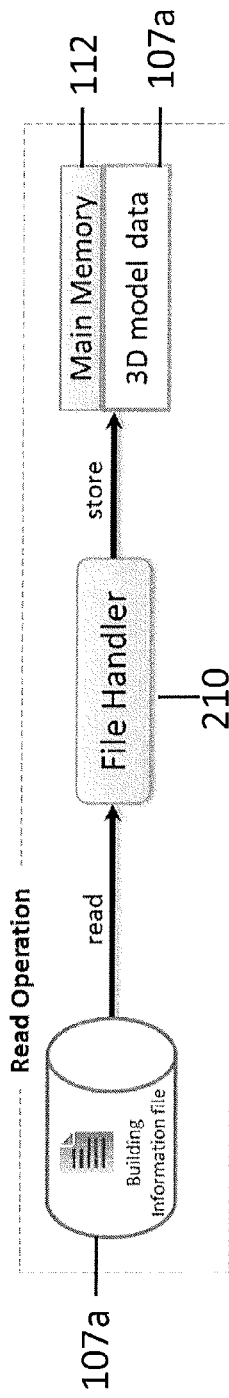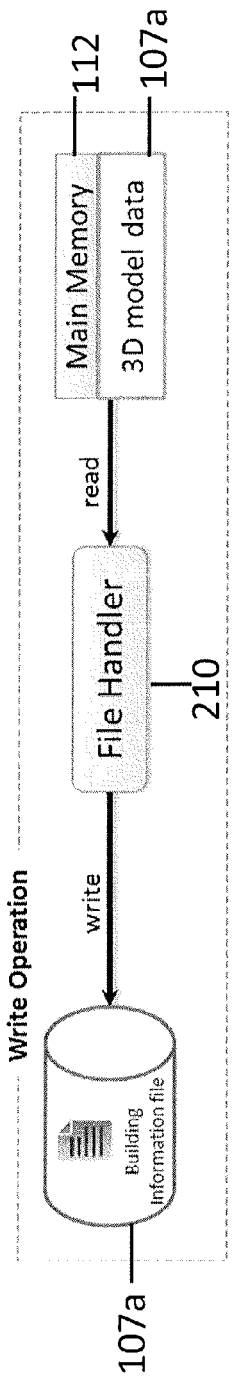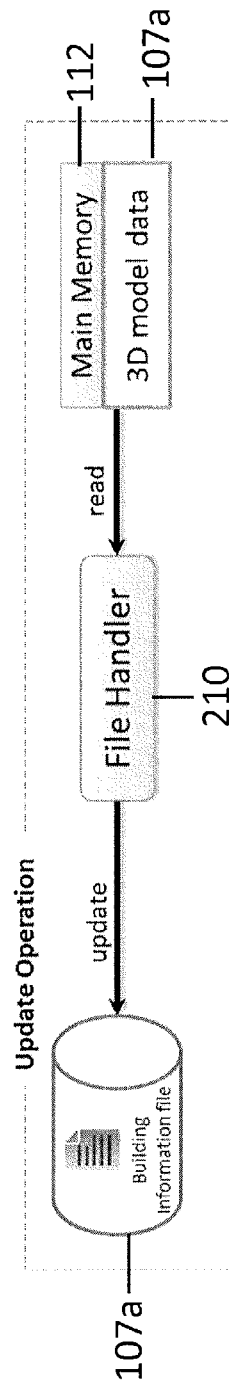

SYSTEM AND METHOD FOR EXPRESS SPREADSHEET VISUALIZATION FOR BUILDING INFORMATION MODELING

CLAIM OF PRIORITY

This application claims priority from U.S. Provisional Patent Application 61/724,143, filed Nov. 8, 2012, which is relied upon and incorporated herein in its entirety by reference.

FIELD OF THE INVENTION

The present invention relates generally to combining visual representation and tabular representation of information and presenting it in the same place. More particularly, the present invention relates to presentation of building information modeling ("BIM") representation of a building in visual and spreadsheet form.

BACKGROUND OF THE INVENTION

BIM representations, created by BIM software, and spreadsheets are common communication means of information exchange between stakeholders in building projects. The BIM representation is involved from inception of the development concept to the maintenance of completed facility. During various stages of the development, the BIM representation is exchanged between various stakeholders and enriched at each phase. The BIM representation is used to convey the design content. In many aspects, the BIM representation can be conveyed in the form of 2D and 3D visual representations. FIG. 1 shows the typical visual representation of building components provided by BIM software. Spreadsheets are used to display various numerical and textual artifacts about the building derived from building components. FIG. 2 illustrates an example of a spreadsheet program displaying the various numerical and textual artifacts.

However, the BIM representation and spreadsheet applications do not function together. Typically, the BIM software and spreadsheet programs are incompatible software applications that are not capable of communicating with one another. Stakeholders interested in both aspects of the information have to open one software system to see the 3D formatted BIM representation and another software system to see spreadsheet format. As a result, relating the asynchronous information from these two distinct resources has been very difficult.

In addition, to analyze and trace the spreadsheet data in the 3D BIM software, which renders validation of spreadsheet information, is virtually impossible. For example, if a user decides to make changes in one format, she needs to manually update the other format. This process increases the possibility of human errors and leads to asynchronous information in different formats. The effect magnifies as the model information matures over different stages resulting in huge costs during the construction and maintenance phases.

Current systems either deal with spreadsheet or BIM representations. Due to this, stakeholders have to use different systems to relate and trace the data. That requires switching between systems in order to comprehend and update the information. The process is cumbersome and hence the comprehension and updating are tedious and error prone. Therefore, there is a need for a single system that can provide spreadsheet applications and BIM applications. Further, there is a need for such a system to automatically synchronize between the spreadsheet and BIM applications. There is a further need for such a system to automatically synchronize the data between the two applications when data is modified or updated utilizing either application.

SUMMARY OF THE PRESENT INVENTION

The present invention provides an efficient solution to a lingering issue of asynchronous information between visual models as represented by visualization software and corresponding information about the models represented by spreadsheet software.

The present invention is an express spreadsheet visualization (ESV) system consisting of visualization and spreadsheet applications/software sub-systems and mechanisms. The ESV system presents model information from distinct sources, visualization and spreadsheet files, to the user and synchronizes both representations in real time. The ESV system is configured to keep all distinct information sources to be current with respect to user inputs. The visualization and spreadsheet applications/software subsystems are used to interpret information from visualization model files and spreadsheet files respectively and present it to the user. The mechanisms are used to synchronize the corresponding presentations of the information, viz. spreadsheet view and visualization view. The visualization view can include, but is not limited to, displaying the model components in 2D and/or 3D form.

In an aspect, the ESV system is applicable, but not limited, to modeling by the BIM software. In the process, various stake holders need to exchange information about a model of a facility. For example, a facility can be a building, including, but not limited to, a school, an apartment, a market complex, and the like. In other aspects, the ESV system can be utilized in any other design field that needs a combination of visualization modeling and listing or disclosure of other relevant component information.

In an aspect, the invention is capable of reading both spreadsheet and visual modeling (2D and 3D) formats using software sub-systems and presenting it on the same display to the user. The ESV system is also capable of synchronizing the information from one application/subsystem to another. The synchronization prevents information gaps in different formats, thereby reducing the costs due to asynchronous. The invention presents a paradigm shift in checking models created by BIM software for quality by giving all the pertinent information in two distinct representations in one place, preventing the probabilities of human error.

These and other objects and advantages of the invention will become apparent from the following detailed description of the preferred embodiment of the invention.

Both the foregoing general description and the following detailed description are exemplary and explanatory only and are intended to provide further explanation of the invention as claimed. The accompanying drawings are included to provide a further understanding of the invention and are incorporated in and constitute part of this specification, illustrate several embodiments of the invention, and together with the description serve to explain the principles of the invention.

BRIEF DESCRIPTION OF THE DRAWINGS

FIG. 2 is screenshot of BIM data as presented in spreadsheet software known in the art.

FIGS. 8A-C depict the operations of a file handler module of a visualization application of the ESV system according to an aspect of the present invention.

DETAILED DESCRIPTION

Figure 1:
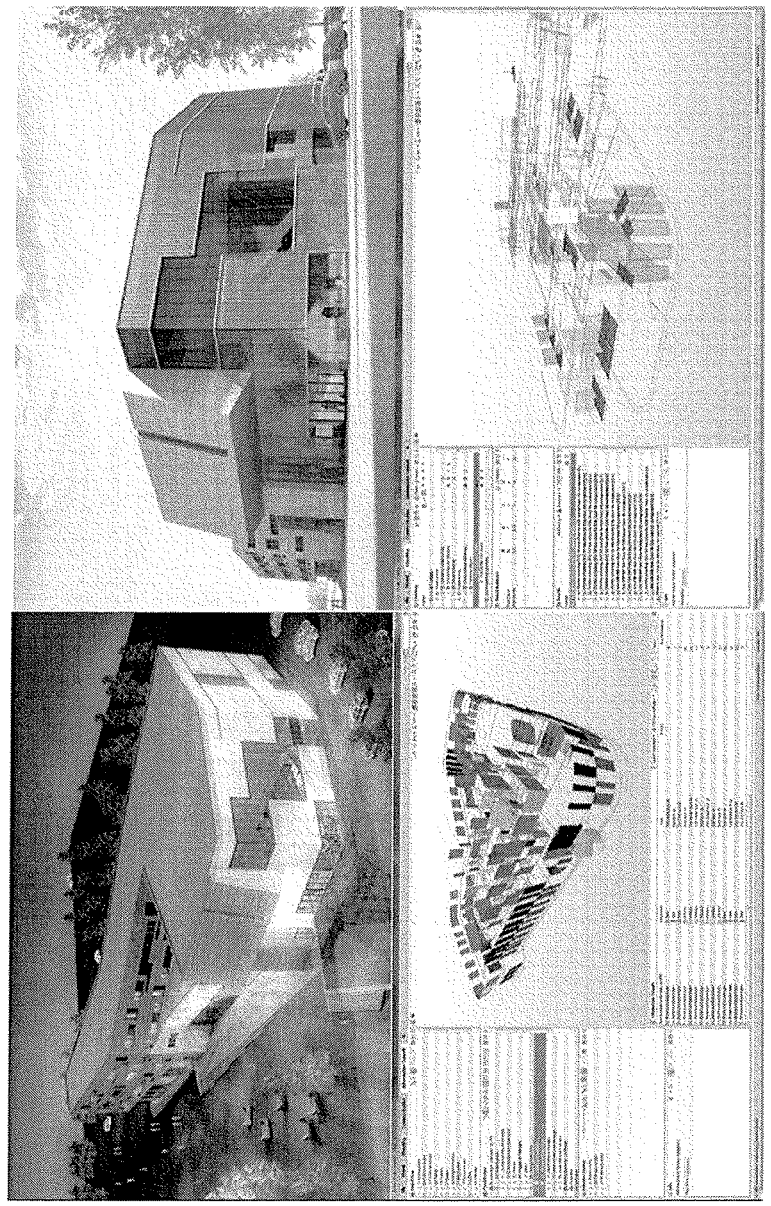
FIG. 1 is a screenshot of 3D model data in 3D modeling software known in the prior art.

The present invention will now be described more fully hereinafter with reference to the accompanying drawings, which are intended to be read in conjunction with this detailed description, the summary, and any preferred and/or particular embodiments specifically discussed or otherwise disclosed. This invention may, however, be embodied in many different forms and should not be construed as limited to the embodiments set forth herein. Instead, these embodiments are provided by way of illustration only and so that this disclosure will be thorough, complete and will fully convey the full scope of the invention to those skilled in the art.

Definitions: The following terms are used throughout the specification and claims.

STAKEHOLDER: Stakeholder is a person who plays a role in design and development of a facility. A stakeholder can include, but is not limited to, an owner or represent of the owner of the facility, an architect, mechanical engineer, electrical engineer, construction manager, civil engineer, interior designer, contractors and like.

Figure 2:
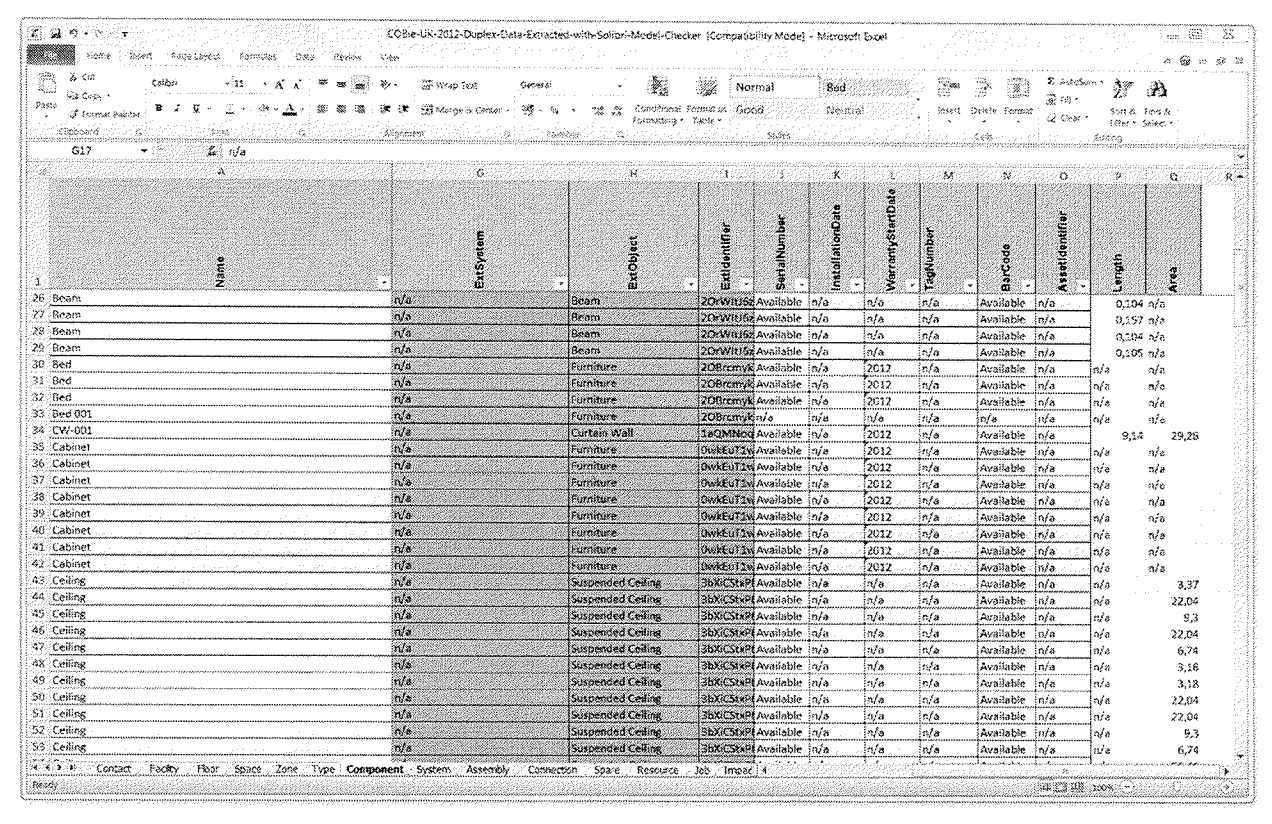

SPREADSHEET APPLICATION: A spreadsheet presents information in a tabular form. Interactive computer software allows users to enter and see data directly in that form. FIG. 2 shows a screenshot of Microsoft Excel, spreadsheet software that is commonly used for the purpose.

BIM APPLICATION: Building Information Modeling (BIM) application creates a digital representation, a BIM representation, of physical and functional characteristics of a facility, including, but not limited to buildings, plants, or infrastructure. A BIM representation is a shared knowledge resource for information about a facility forming a reliable basis for decisions during its life-cycle, which is defined as existing from earliest conception to demolition. In use in this application, a BIM representation can include all types of modeling information, and not just facilities. For example, the information can relate to product development modeling.

VISUALIZATION APPLICATION/SOFTWARE: As used in this specification and the appended claims, a visualization application is capable of reading details from visualization files and displaying the information to a display device. The term visualization application in this application can include 2D model software and 3D model software. 2D model software is capable of reading details from 2D model files and displaying the information to a display device. 3D model software is capable of reading details from a 3D model file and displaying it to a display device. Interactive 2D and 3D model software also allows users to make changes to the model and store the changes to the file.

As used in the specification and the appended claims, the singular forms "a," "an" and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal embodiment. "Such as" is not used in a restrictive sense, but for explanatory purposes.

Disclosed are components that can be used to perform the disclosed methods and systems. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all methods and systems. This applies to all aspects of this application including, but not limited to, steps in disclosed methods. Thus, if there are a variety of additional steps that can be performed it is understood that each of these additional steps can be performed with any specific embodiment or combination of embodiments of the disclosed methods.

As will be appreciated by one skilled in the art, the methods and systems may take the form of an entirely hardware embodiment, an entirely software embodiment, or an embodiment combining software and hardware aspects. Furthermore, the methods and systems may take the form of a computer program product on a computer-readable storage medium having computer-readable program instructions (e.g., computer software) embodied in the storage medium. More particularly, the present methods and systems may take the form of web-implemented computer software. In addition, the present methods and systems may be implemented by centrally located servers or cloud services. Any suitable computer-readable storage medium may be utilized including hard disks, CD-ROMs, optical storage devices, or magnetic storage devices.

Embodiments of the methods and systems are described below with reference to block diagrams and flowchart illustrations of methods, systems, apparatuses and computer program products. It will be understood that each block of the block diagrams and flowchart illustrations, and combinations of blocks in the block diagrams and flowchart illustrations, respectively, can be implemented by computer program instructions. These computer program instructions may be loaded onto a general purpose computer, special purpose computer, computers and components found in cloud services, or other programmable data processing apparatus to produce a machine, such that the instructions which execute on the computer or other programmable data processing apparatus create a means for implementing the functions specified in the flowchart block or blocks.

These computer program instructions may also be stored in a computer-readable memory that can direct a computer or other programmable data processing apparatus to function in a particular manner, such that the instructions stored in the computer-readable memory produce an article of manufacture including computer-readable instructions for implementing the function specified in the flowchart block or blocks. The computer program instructions may also be loaded onto a computer or other programmable data processing apparatus to cause a series of operational steps to be performed on the computer or other programmable apparatus to produce a computer-implemented process such that the instructions that execute on the computer or other programmable apparatus provide steps for implementing the functions specified in the flowchart block or blocks.

Accordingly, blocks of the block diagrams and flowchart illustrations support combinations of means for performing the specified functions, combinations of steps for performing the specified functions and program instruction means for performing the specified functions. It will also be understood that each block of the block diagrams and flowchart illustrations, and combinations of blocks in the block diagrams and flowchart illustrations, can be implemented by special purpose hardware-based computer systems that perform the specified functions or steps, or combinations of special purpose hardware and computer instructions.

The methods and systems that have been introduced above, and discussed in further detail below, have been and will be described as comprised of units. One skilled in the art will appreciate that this is a functional description and that the respective functions can be performed by software, hardware, or a combination of software and hardware. A unit can be software, hardware, or a combination of software and hardware. In one exemplary aspect, the units can comprise a computer. This exemplary operating environment is only an example of an operating environment and is not intended to suggest any limitation as to the scope of use or functionality of operating environment architecture. Neither should the operating environment be interpreted as having any dependency or requirement relating to any one or combination of components illustrated in the exemplary operating environment.

The present methods and systems can be operational with numerous other general purpose or special purpose computing system environments or configurations. Examples of well-known computing systems, environments, and/or configurations that can be suitable for use with the systems and methods comprise, but are not limited to, personal computers, server computers, laptop devices, cloud services, mobile devices (e.g., smart phones, tablets, and the like) and multiprocessor systems. Additional examples comprise set top boxes, programmable consumer electronics, network PCs, minicomputers, mainframe computers, enterprise servers, distributed computing environments that comprise any of the above systems or devices, and the like.

The processing of the disclosed methods and systems can be performed by software components. The disclosed systems and methods can be described in the general context of computer-executable instructions, such as program modules, being executed by one or more computers or other devices. Generally, program modules comprise computer code, routines, programs, objects, components, data structures, etc. that perform particular tasks or implement particular abstract data types. The disclosed methods can also be practiced in grid-based and distributed computing environments where tasks are performed by remote processing devices that are linked through a communications network. In a distributed computing environment, program modules can be located in both local and remote computer storage media including memory storage devices.

Figure 3:
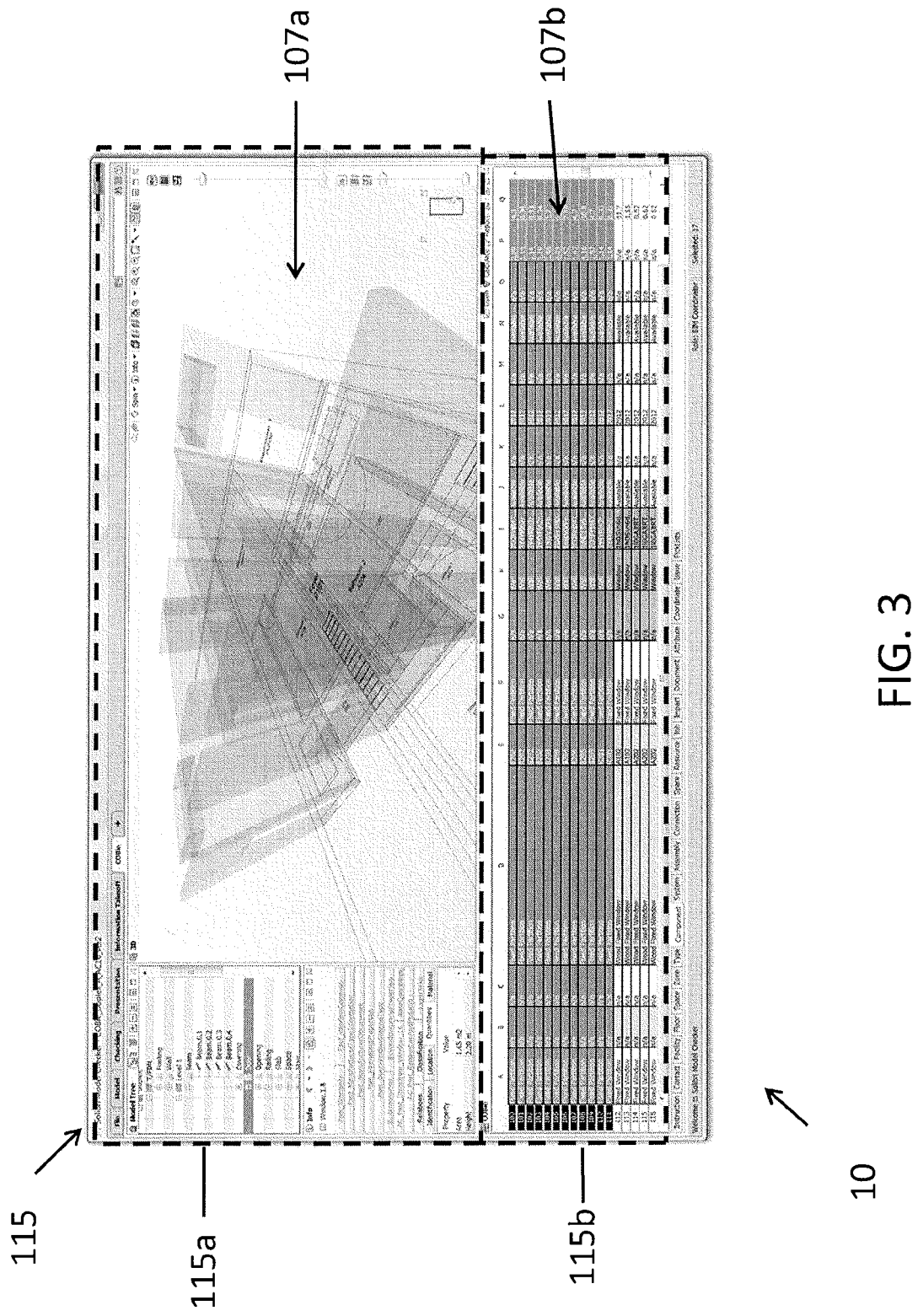
FIG. 3 is a depiction of a screen show created by an express spreadsheet visualization (ESV) system according to an embodiment of the present invention.
Figure 4:
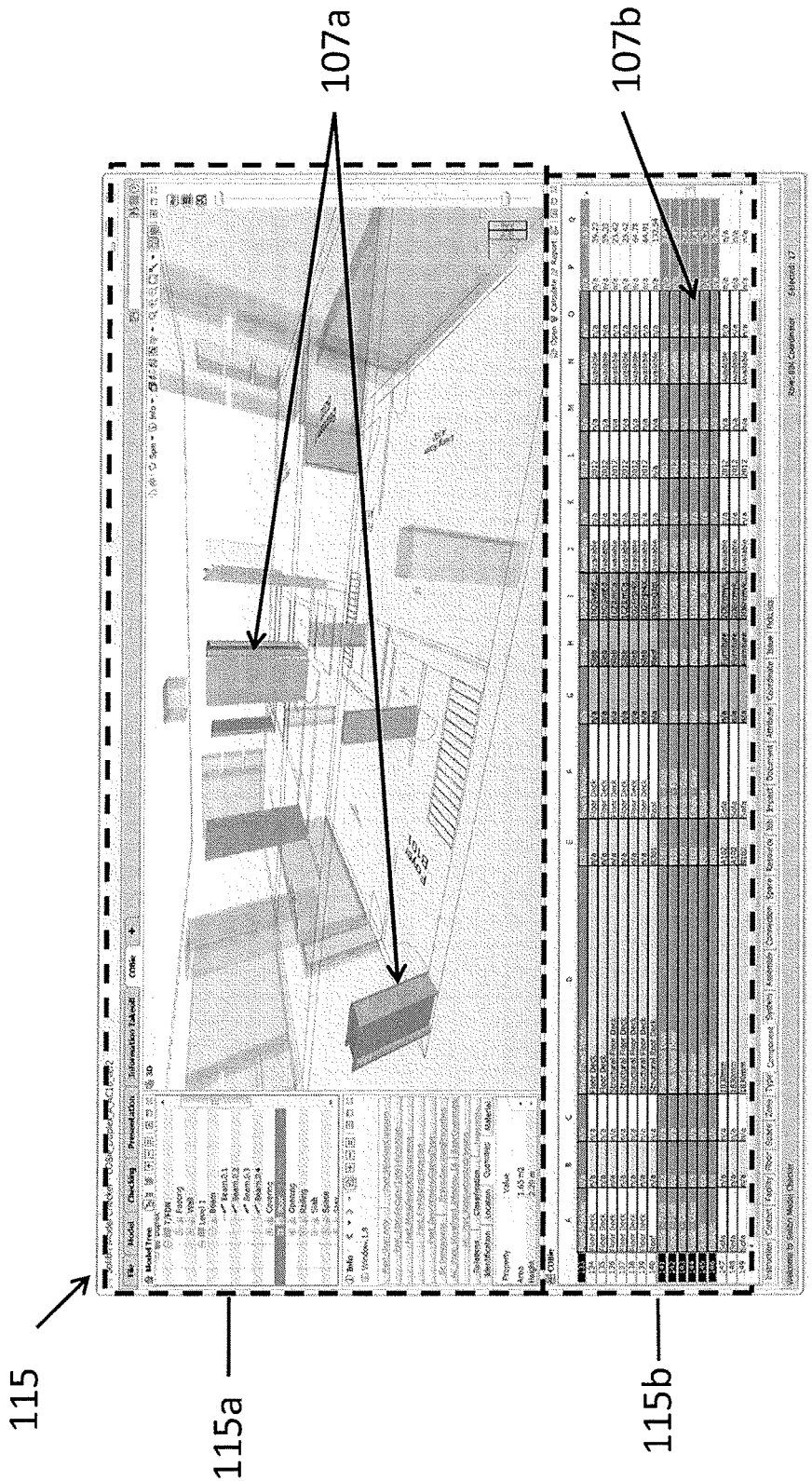
FIG. 4 is a depiction of a screen show created by the ESV system according to an embodiment of the present invention.
Figure 5:
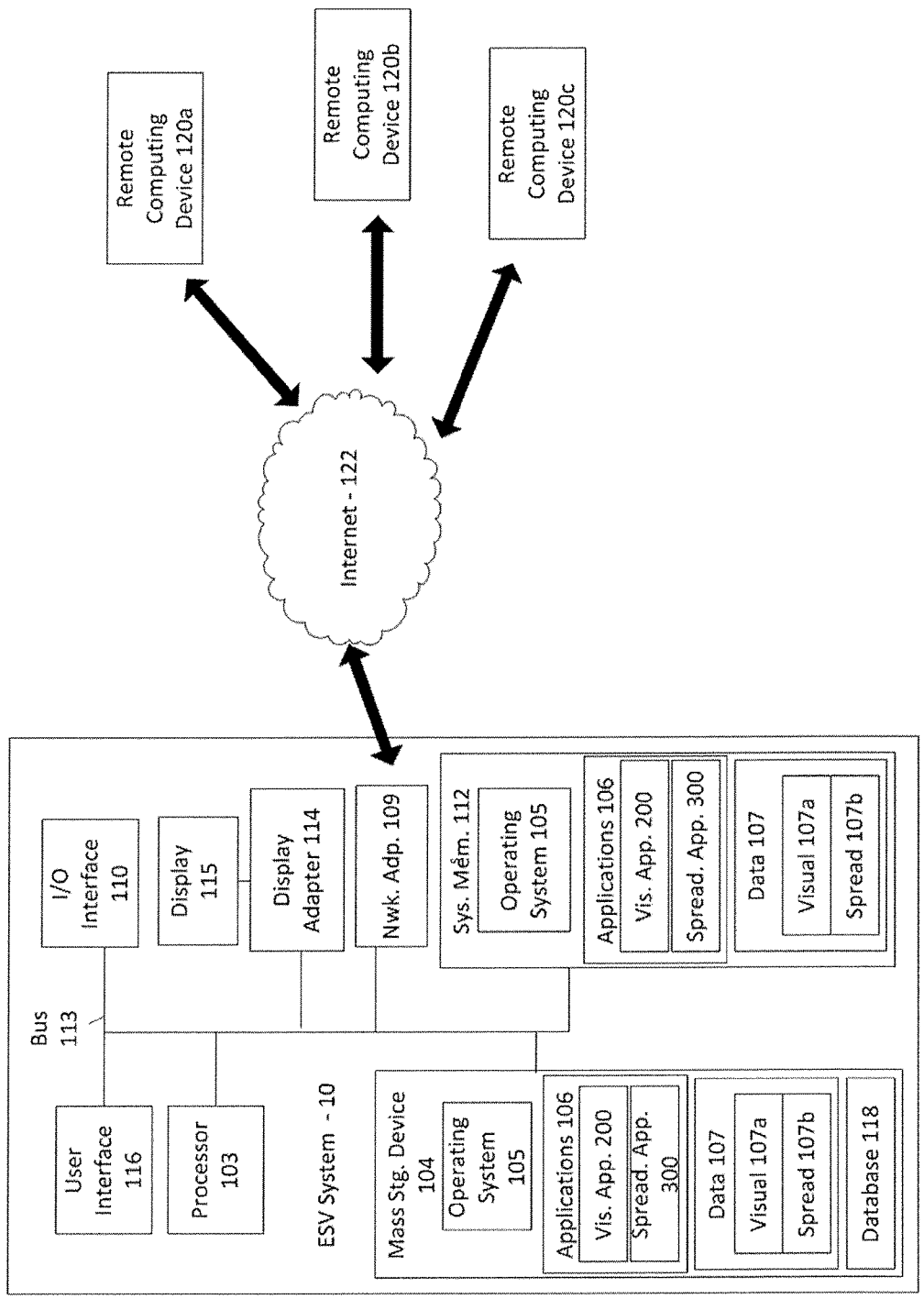
FIG. 5 is an architecture block diagram representation of the ESV system according to an embodiment of the present invention.

As illustrated in FIGS. 3-5, the present invention is directed to an express spreadsheet visualization ("ESV") system 10 configured to display, update, and synchronize BIM representations across spreadsheet and visualization applications, discussed in more detail below. In an aspect, the ESV system 10 is configured to display simultaneously BIM representation data 107 on a display device 115, shown in FIGS. 3-4. In an exemplary aspect, the ESV system 10 is further configured to display the BIM representation data 107 as visualization information 107a and spreadsheet information 107b in a visualization display portion 115a and a spreadsheet display portion 115b respectively of the display device 115, as shown in FIGS. 3-4.

In an aspect, the EVS system 10 is configured to allow a user or stakeholder to interact with the BIM representation across spreadsheet applications and visualization handling applications. In an exemplary aspect, the ESV system 10 is configured to handle model representations associated with buildings and other types of facilities (e.g., schools, apartments, market complexes, factories, etc.). In other aspects, the ESV system 10 can be used in product design and development, other industries which utilize modeling, and in any system where information comes from and is presented in distinct sources in a synchronized fashion.

As shown in FIG. 5, the ESV system 10 can be implemented via a general-purpose computing device in the form of a computer shown in FIG. 3. Referring to FIG. 3, the ESV system 10 may have several applications 106, including, but not limited to, a visualization application 200 and a spreadsheet application 300. In an aspect, while FIG. 3 illustrates the ESV system 10 and its applications 106 in the form of a general-purpose computing device, in other embodiments the ESV system 10 may utilize elements and/or modules of several nodes or servers that make up cloud services and the like. In any event, the ESV system 10 should be construed as inclusive of multiple modules, software applications, servers and other components.

The components of the ESV system 10, in addition to the applications 106, including the visualization application 200 and the spreadsheet application 300, can comprise, but are not limited to, one or more processors or processing units 103, a system memory 112, and a system bus 113 that couples various system components including the processor 103 to the system memory 112. In the case of multiple processing units 103, the ESVS 10 can utilize parallel computing.

The system bus 113 represents one or more of several possible types of bus structures, including a memory bus or memory controller, a peripheral bus, an accelerated graphics port, and a processor or local bus using any of a variety of bus architectures. By way of example, such architectures can comprise an Industry Standard Architecture (ISA) bus, a Micro Channel Architecture (MCA) bus, an Enhanced ISA (EISA) bus, a Video Electronics Standards Association (VESA) local bus, an Accelerated Graphics Port (AGP) bus, and a Peripheral Component Interconnects (PCI), a PCI-Express bus, a Personal Computer Memory Card Industry Association (PCMCIA), Universal Serial Bus (USB) and the like. The bus 113, and all buses specified in this description can also be implemented over a wired or wireless network connection and each of the subsystems, including the processor 103, a mass storage device 104, an operating system 105, applications 106, including, but not limited to, the transformation application 108, a network adapter 109, system memory 112, an Input/Output Interface 110, a display adapter 114, a display device 115, and a user interface 116. As discussed above, these components can be contained within one or more remote computing devices at physically separate locations, connected through buses of this form, in effect implementing a fully distributed system.

The ESV system 10 typically comprises a variety of computer readable media. Exemplary readable media can be any available media that is accessible by the ESV system 10 and comprises, for example and not meant to be limiting, both volatile and non-volatile media, removable and non-removable media. The system memory 112 comprises computer readable media in the form of volatile memory, such as random access memory (RAM), and/or non-volatile memory, such as read only memory (ROM). The system memory 112 typically contains data such as BIM representation data 107 and/or program modules such as operating system 105, the visualization application 200, and the spreadsheet application 300 that are immediately accessible to and/or are presently operated on by the processing unit 103.

In an aspect, the BIM representation data 107 can be divided into visualization information 107a that is utilized by the visualization application 200 and spreadsheet information 107b utilized by the spreadsheet application 300. The visualization information 107a can include information that is used for 2D and 3D model information used to create visual representations of the facility/building to convey design content. The spreadsheet information 107b can include information that represents the various numerical and textual artifacts about the building derived from building components. The visualization information 107a and the spreadsheet information 107b can be associated with separate files for use with the visualization application 200 and the spreadsheet application 300 (i.e., visualization information file 107a, spreadsheet information file 107b). In use, discussed in detail below, each visualization file 107a should have a corresponding spreadsheet file 107b that is associated with a single model.

In another aspect, the ESV system 10 can also comprise other removable/non-removable, volatile/non-volatile computer storage media. By way of example, FIG. 3 illustrates a mass storage device 104 which can provide non-volatile storage of computer code, computer readable instructions, data structures, including databases 118, program modules, and other data for the ESV system 10. For example and not meant to be limiting, a mass storage device 104 can be a hard disk, a removable magnetic disk, a removable optical disk, magnetic cassettes or other magnetic storage devices, flash memory cards, CD-ROM, digital versatile disks (DVD) or other optical storage, random access memories (RAM), read only memories (ROM), electrically erasable programmable read-only memory (EEPROM), and the like.

Optionally, any number of program modules can be stored on the mass storage device 104, including by way of example, an operating system 105, the visualization application 200 and the spreadsheet application 300. Each of the operating system 105 and other applications (including the visualization application 200 and spreadsheet application 300) (or some combination thereof) can comprise elements of the programming and the other applications, modules, and like described herein. BIM representation information/data 107, including visualization information 107a and spreadsheet information 107b, can also be stored on the mass storage device 104. In another aspect, the BIM representation data 107, including the visualization information 107a and the spreadsheet information 107b can be stored as separate files. In another aspect, the data 107 can be stored in a database 118. BIM data 107 can be stored in any of one or more databases known in the art. The databases can be centralized or distributed across multiple systems.

In another aspect, the user can enter commands and information into the ESV system 10 via an input device (not shown). Examples of such input devices comprise, but are not limited to, a keyboard, pointing device (e.g., a "mouse"), a microphone, a joystick, a scanner, tactile input devices such as gloves, and other body coverings, and the like. Further examples can include image capturing devices, such as, but not limited to, optical coherence tomography capturing devices, fundus cameras, scanning laser ophthalmoscope, and other devices used to capture images and other information related to the monitoring and examination of eyes. These and other input devices can be connected to the processing unit 103 via a human machine interface 116 that is coupled to the system bus 113, but can be connected by other interface and bus structures, such as a parallel port, game port, an IEEE 1394 Port (also known as a Firewire port), a serial port, or a universal serial bus (USB), or network connection.

In yet another aspect, a display device 115 can also be connected to the system bus 113 via an interface, such as a display adapter 114. It is contemplated that the mobile ESV system 10 can have more than one display adapter 114 and the ESV system 10 can have more than one display device 115. For example, a display device can be a monitor, an LCD (Liquid Crystal Display), or a projector. In addition to the display device 115, other output peripheral devices can comprise components such as speakers (not shown) and a printer (not shown) which can be connected to ESV system 10 via Input/Output Interface 110. Any step and/or result of the methods can be output in any form to an output device. Such output can be any form of visual representation, including, but not limited to, textual, graphical, animation, audio, tactile, and the like.

The ESV system 10 can operate in a networked environment using logical connections to one or more remote computing devices 120*a,b,c*. By way of example, a remote computing device can be a personal computer, portable computer, a server, a router, a network computer, a wireless connected tablet or mobile device, a peer device or other common network node, and so on. Logical connections between the ESV system 10 and a remote computing device 120*a,b,c* can be made via a local area network (LAN) and a general wide area network (WAN). Such network connections can be through a network adapter 109. A network adapter 109 can be implemented in both wired and wireless environments. Such networking environments are conventional and commonplace in offices, enterprise-wide computer networks, intranets, cellular networks and the Internet 122.

For purposes of illustration, application programs and other executable program components such as the operating system 105 are illustrated herein as discrete blocks, although it is recognized that such programs and components reside at various times in different storage components of the ESV system 10 and are executed by the data processor(s) of the computer. An implementation of the visualization application 200 and/or the spreadsheet application 300 can be stored on or transmitted across some form of computer readable media. Any of the disclosed methods can be performed by computer readable instructions embodied on computer readable media. Computer readable media can be any available media that can be accessed by a computer. By way of example and not meant to be limiting, computer readable media can comprise "computer storage media" and "communications media." "Computer storage media" comprise volatile and non-volatile, removable and non-removable media implemented in any methods or technology for storage of information such as computer readable instructions, data structures, program modules, or other data. Exemplary computer storage media comprises, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

Figure 6:
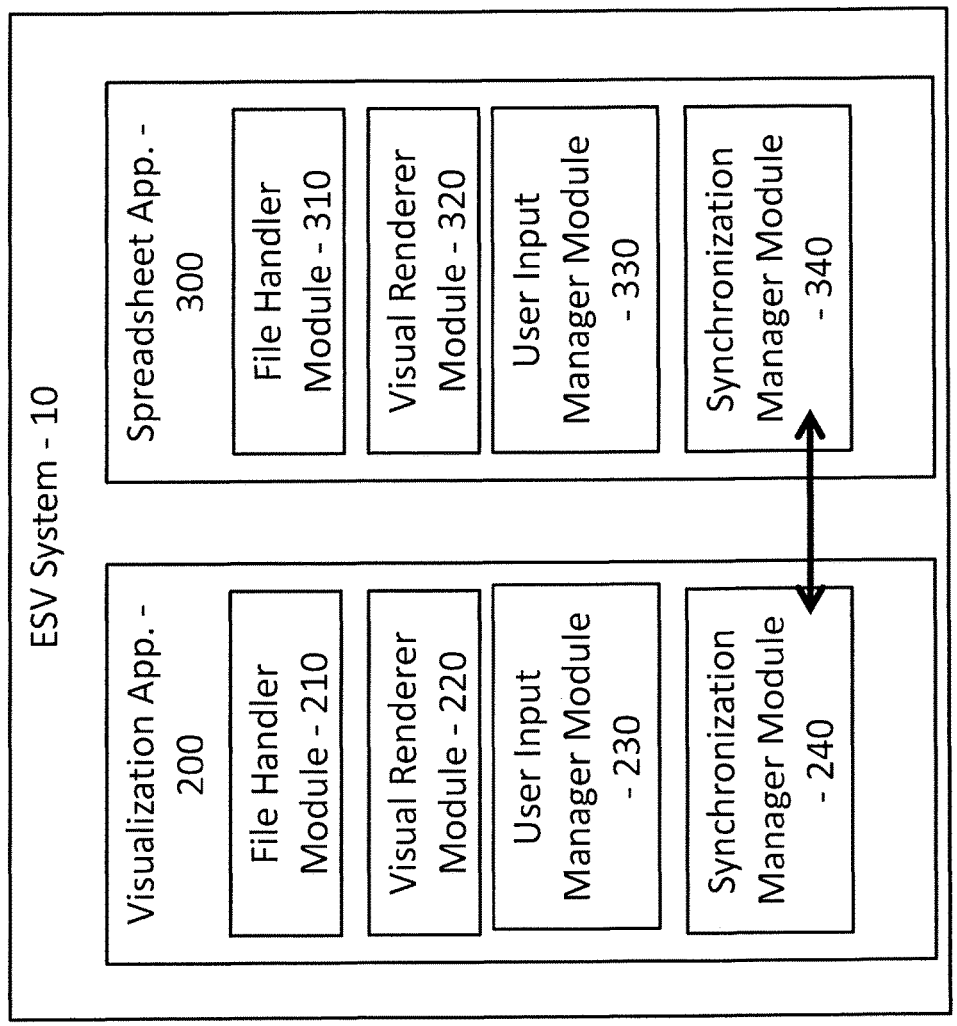
FIG. 6 is an architecture diagram representation of components of the ESV system of FIG. 5.
Figure 7:
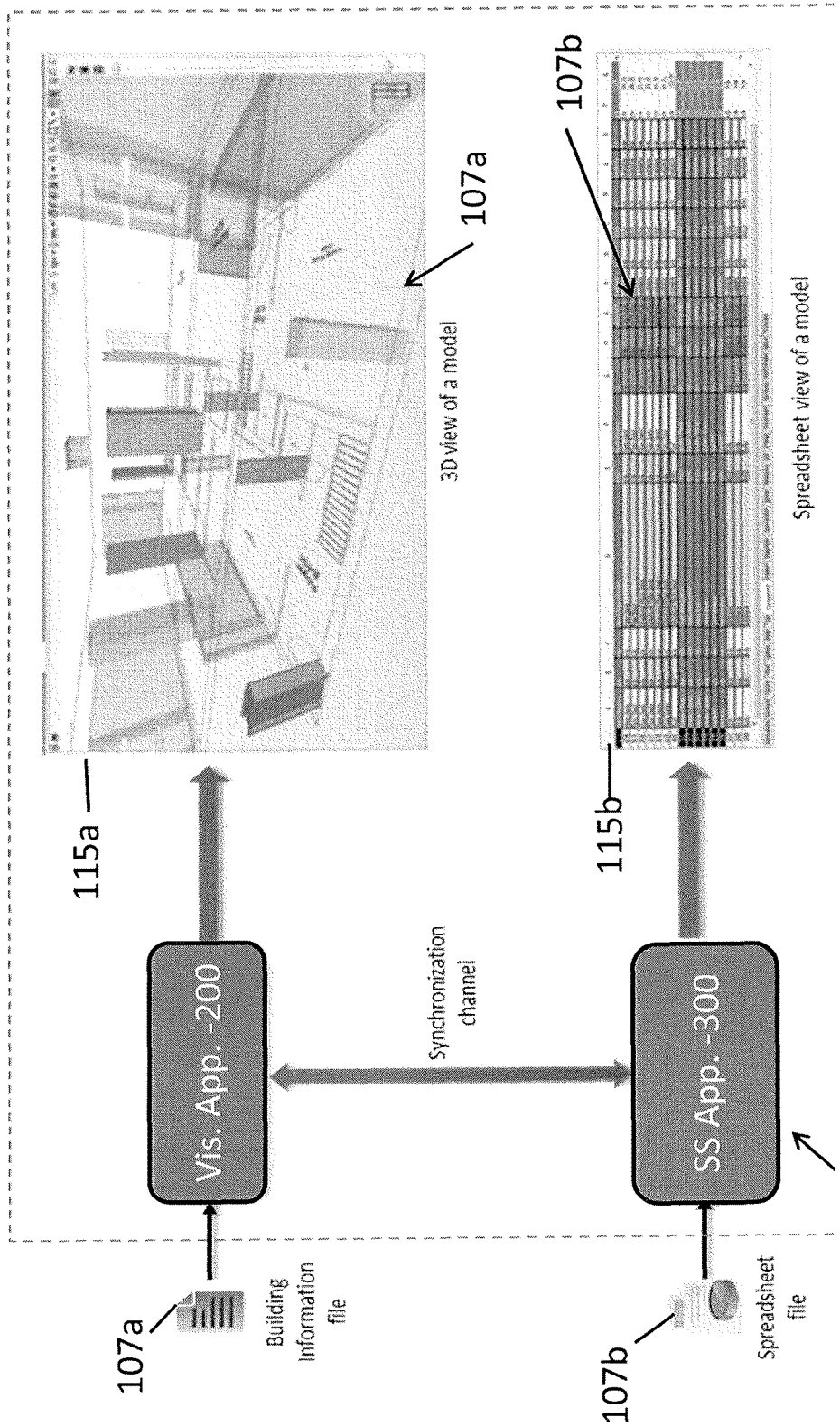
FIG. 7 is a schematic representation of components of the ESV system of FIG. 5.

As shown in FIGS. 6-7, the visualization application 200 and the spreadsheet application 300 are configured to work through the use of several modules. As illustrated in FIG. 6, the visualization application 200 is configured to have a file handler module 210, a visual renderer module 220, a user input manager module 230, and a synchronization manager module 240. Similarly, the spreadsheet application 300 is configured to have a file handler module 310, a visual renderer module 320, a user input manager module 330, and a synchronization manager module 340. The synchronization manager modules 240, 340 of the visualization application 200 and the spreadsheet application 300 are configured to work in concert with one another, as discussed in detail below. The modules discussed above of the visualization application 200 and the spreadsheet application 300 have similar functionality, but operate on and utilize different types of data and produce varying outputs, discussed in more detail below.

As illustrated in FIGS. 6-8 and 9A, the visualization application 200, through the file handler module 210, the visual renderer module 220, the user input manager module 230, and the synchronization manager module 240, is configured to work with the visualization data 107*a*. In addition, the various modules 210, 220, 230, and 240 are configured to work with one another to display, collect, and update the relevant information based upon actions of the user.

For example, the file handler module 210 is configured to read, write, and update the visualization data 107*a*, as shown in FIGS. 8A-C. As shown in FIG. 8A, the file handler module 210 can take the visualization data 107*a*, which can be stored on the mass storage device 104, or from an outside source, and transfer the visualization data 107*a* to the system memory 112 for use by the stakeholder. The transfer of the visualization data 107*a* to the system memory 112 can occur when a user/stakeholder opens a new model with the ESV system 10. As shown in FIG. 8B, the file handler module 210 can also read the visualization data 107*a* being utilized on the system memory 112 and write such information to the file 107*a*, which can be found on the mass storage device 104. The writing of visualization data 107*a* can occur when a user/stakeholder adds details to the model and opts to save such additional details. Lastly, the file handler module 210 can also update the visualization information 107*a* with the file that has been changed or altered on the system memory 112, as shown in FIG. 8C. Updating information 107*a* can occur when the user/stakeholder makes updates to the model and chooses to save them.

Figure 9A:
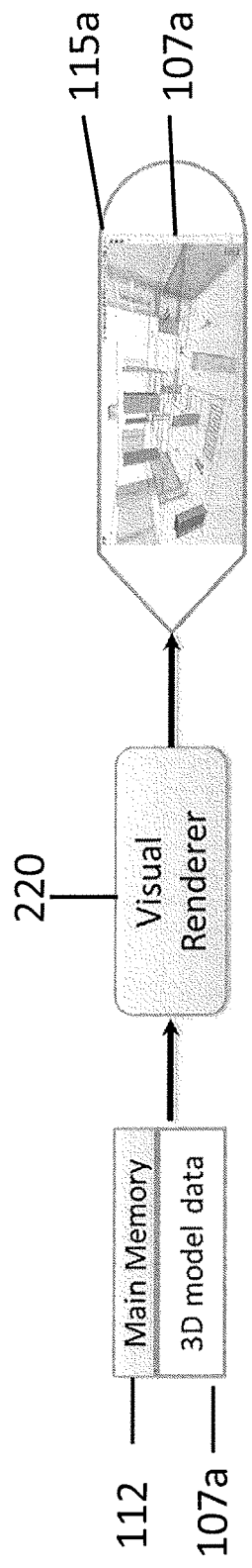
FIG. 9A illustrates the operations of a visual renderer module of a visualization application of the ESV system according to an aspect of the present invention.

The visual renderer module 220 is responsible for reading the visualization data 107*a* to generate the corresponding visual components. FIG. 9A illustrates the functionality of the visual renderer module 220. Once the visualization data 107*a* is found in the memory storage 112, the visual renderer module 220 can generate pertinent graphics to display on the display device 115 so a stakeholder can see the model in an understandable visual form. In an exemplary aspect, the visualization data 107*a* can be displayed on a visualization display portion 115*a* of the display device 115. In an exemplary aspect, the visual renderer module 220 can display the model in a 3D form. In another example, the visual renderer module 220 can display the model in a 2D form. In an aspect, the visual renderer module 220 of the visualization application 200 is configured to display the model simultaneously with spreadsheet view, as shown in FIGS. 3-4.

The user input manager module 230 of the visualization application 200 is configured to capture the actions performed by a stakeholder/user and then translate them for use with the remaining modules. The user input manager module 230 is configured to be responsible for understanding user actions and performing corresponding system actions. For example, when a user makes a change to a component of the model, the input manager module 230 is responsible for capturing that change and calling upon the file handler module 210 and visual renderer module 220 to perform the needed updates. In another example, the input manager module 230 can capture the selection of a component shown to the user (e.g., a user selects a door, via an input device, shown in a 3D model of a building shown on the display device 115) and call on the visual renderer module 220 to highlight the component. The input manager module 230 also captures inputs and sends outputs to the synchronization manager module 240, discussed in more detail below.

As illustrated in FIGS. 9B and 10A-C, the file handler module 310, the visual renderer module 320, the user input manager module 330 and the synchronization manager module 340 of the spreadsheet application 300 are configured to work with the spreadsheet information 107*b*. In addition, the various modules 310, 320, 330, and 340 are configured to work with one another to display, collect, and update the relevant information based upon actions of the user.

Figure 10A:
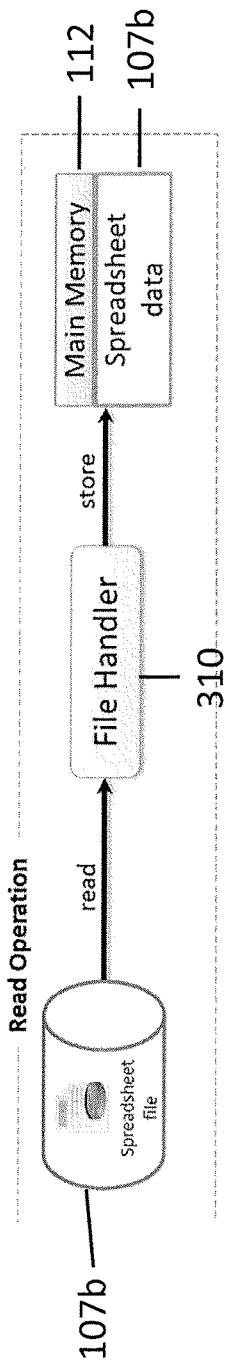
FIGS. 10A-C depict the operations of a file handler module of a visualization application of the ESV system according to an aspect of the present invention.
Figure 10B:
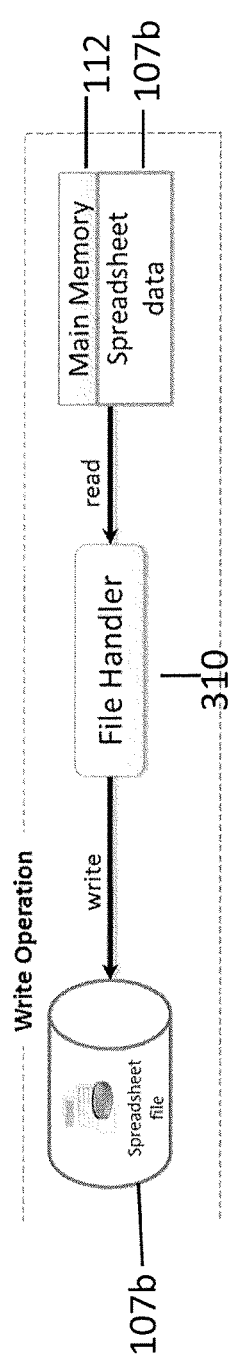
Figure 10C:
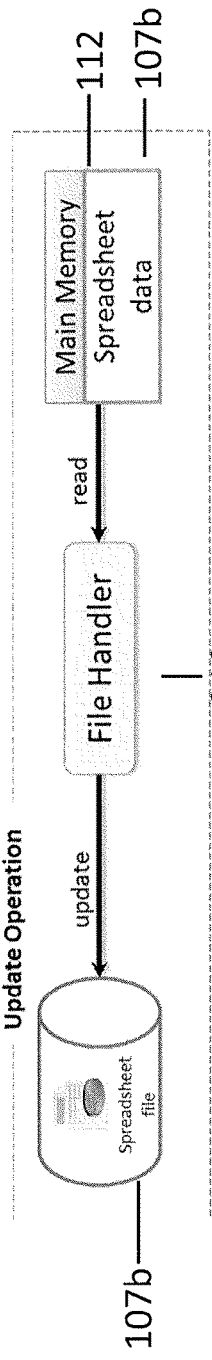

As illustrated in FIGS. 10A-C, the file handler module 310 of the spreadsheet application 300 is configured to read, write, and update the spreadsheet data 107b. The file handler module 310 can take the spreadsheet data 107b, which can be stored on the mass storage device 104, or from an outside source, and transfer the spreadsheet data 107b to the system memory 112 for use by the stakeholder, shown in FIG. 10A. The transfer of the spreadsheet data 107b to the system memory 112 can occur when a user/stakeholder opens a new model with the ESV system 10. As shown in FIG. 10B, the file handler module 310 can also read the spreadsheet data 107ba being utilized on the system memory 112 and write such information to the file 107b, which can be found on the mass storage device 104. The writing of visualization data 107a can occur when a user/stakeholder adds details to the model and opts to save such additional details. Lastly, the file handler module 310 can also update the spreadsheet information 107b with the file that has been changed or altered on the system memory 112, as shown in FIG. 10C. Updating spreadsheet information 107b can occur when the user/stakeholder makes updates to the model and chooses to save them.

Figure 9B:
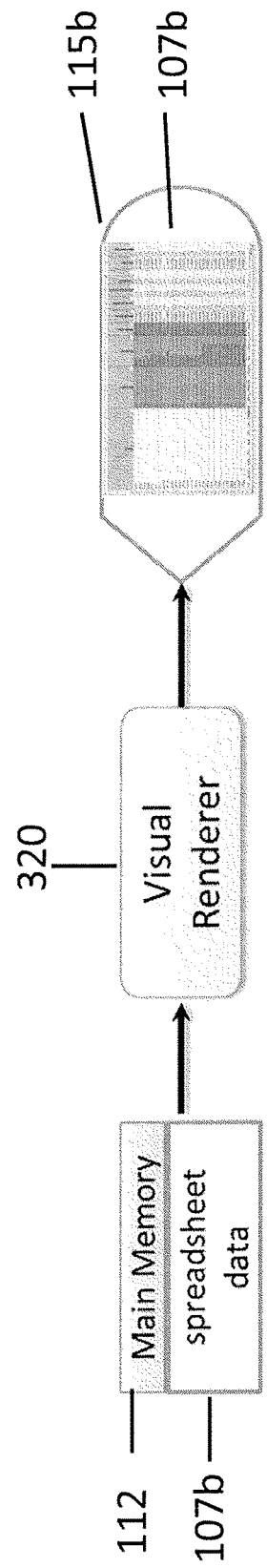
FIG. 9B illustrates the operations of a visual renderer module of a spreadsheet application of the ESV system according to an aspect of the present invention.

The visual renderer module 320 of the spreadsheet application is responsible for reading the spreadsheet data 107b to generate the corresponding visual components. FIG. 9B illustrates the functionality of the visual renderer module 320. Once the visualization data 107a is found in the memory storage 112, the visual renderer module 320 can generate pertinent generating pertinent text and tables so that user could see the details in tabular form the display device 115. In an exemplary aspect, the spreadsheet data 107b can be displayed on a spreadsheet display portion 115a of the display device 115.

The user input manager module 330 of the spreadsheet application 300 is configured to capture the actions performed by a stakeholder/user and then translate them for use with the remaining modules. The user input manager module 330 is configured to be responsible for understanding user actions and performing corresponding system actions. For example, when a user makes a change to information, the input manager module 330 is responsible for capturing that change and calling upon the file handler module 310 and visual renderer module 320 to perform the needed updates. In another example, the input manager module 330 can capture the selection of a particular cell or group of cells shown to the user and call on the visual renderer module 320 to highlight the selected cell(s). The input manager module 330 also captures inputs and sends outputs to the synchronization manager module 340, as discussed in more detail below.

The synchronization manager module 240 of the visualization application 200 is configured to communicate with the synchronization manager module 340 of the spreadsheet application 300. The synchronization manager modules 240, 340 of the visualization application 200 and the spreadsheet application 300 work together to make sure that the visualization information 107a and the spreadsheet information 107b match each other once corresponding information is selected, changed, or added. The synchronization manager modules 240, 340 ensure the visual representations made by the visualization application 200 match the visual representations of spreadsheet application 300. In an addition aspect, the synchronization manager modules 240, 340 ensure that when a component of a visual representation of model data 107a is selected or highlighted by a user/stakeholder, the same visual representation of the spreadsheet data 107b is also highlighted, and vice versa, discussed in more detail below.

As discussed above, a stakeholder/user will load the data 107 for a particular facility, and more particular, a visualization file 107a and a corresponding spreadsheet file 107b for the facility or product. Therefore, it is assumed and essential that the user has uploaded or saved files that contain visualization data 107a and spreadsheet data 107b of the same model. In another aspect, the visualization data files 107a and the spreadsheet data files 107b include model identifiers (e.g., 3D_ID and SP_ID as illustrated in FIGS. 12A-B) that identify to which model the files 107a, 107b correspond.

Figure 11:
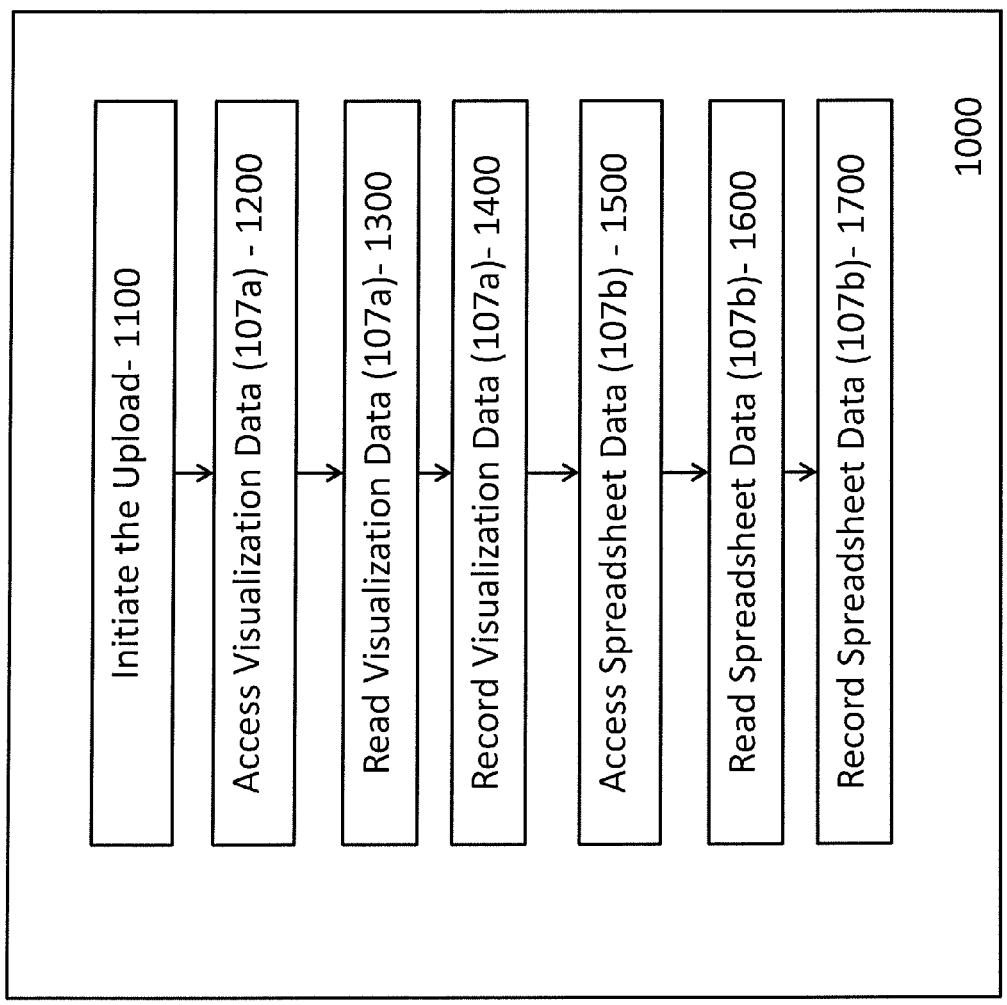
FIG. 11 depicts a method performed by the ESV system according to an aspect of the present invention.
Figure 12:
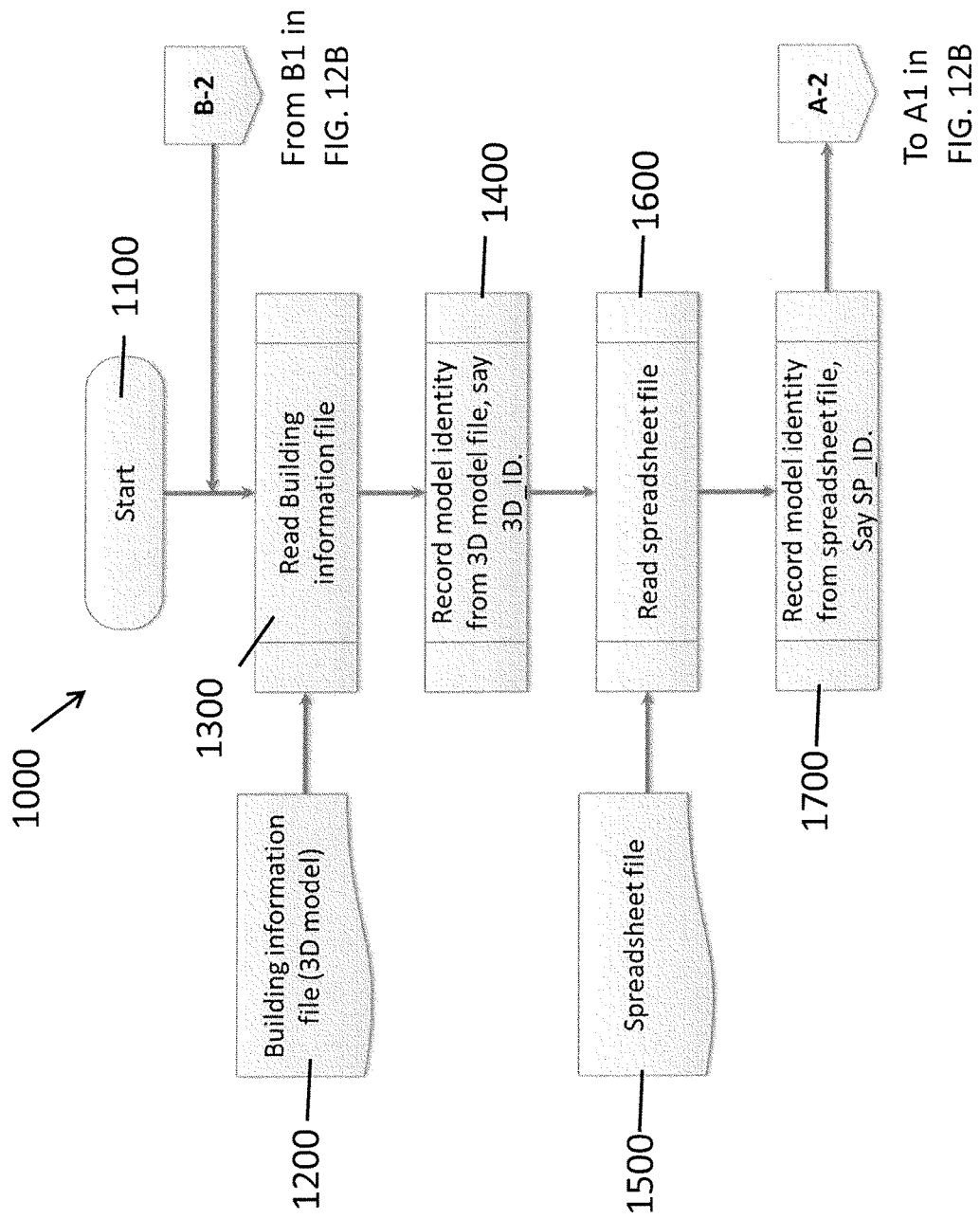
FIGS. 12A-B are flow charts depicting a validation method performed by the ESV system according to an embodiment of the present invention.
Figure 12B:
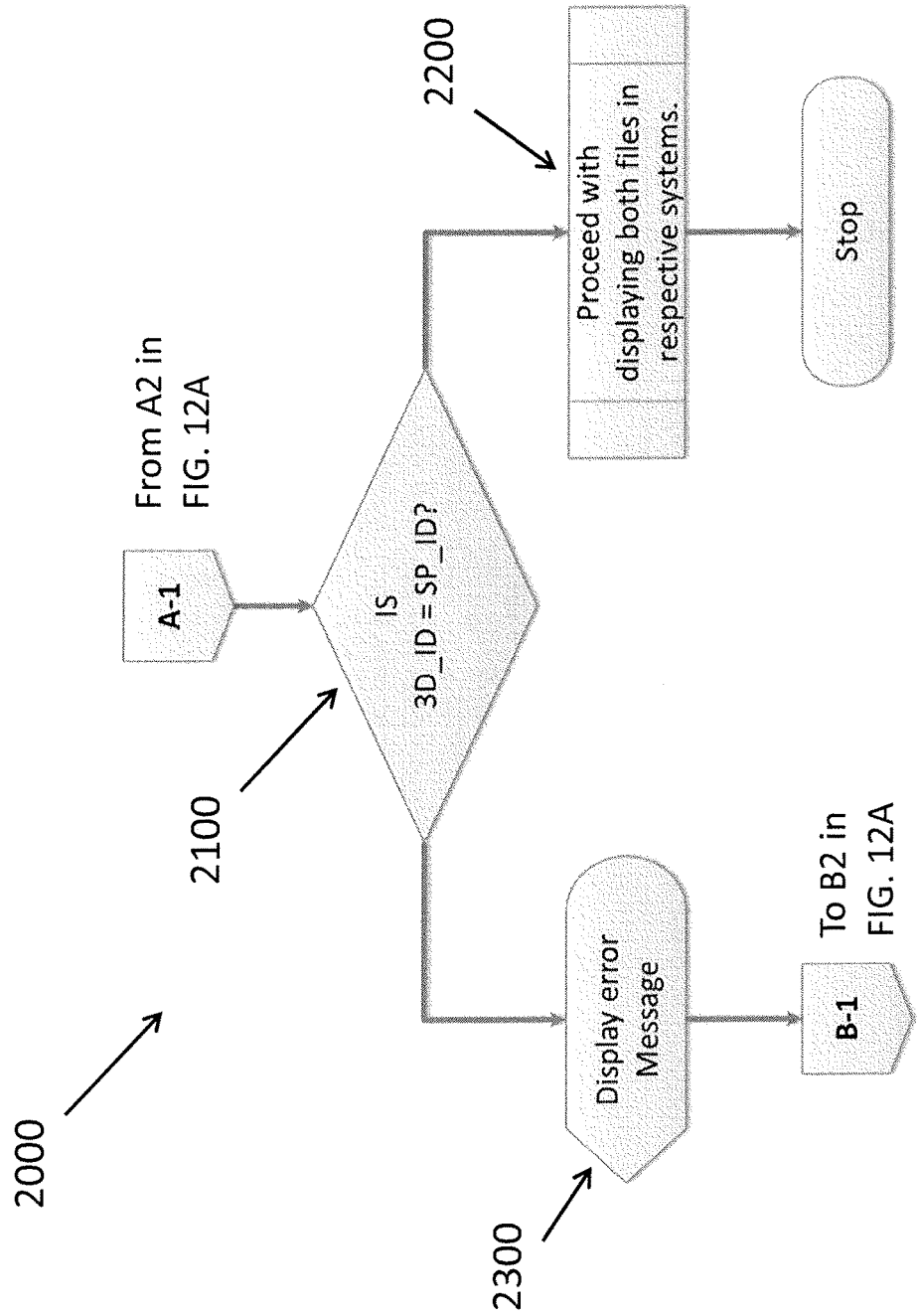

FIGS. 11 and 12A illustrate a method (1000) of loading the files to the system memory 112 of the ESV system 10 according to an aspect. The user can first initiate the EVS system 10 (step 1100). This can be done by the user activating the EVS system 10 initially, or turning to new information 107 to be examined. The user can then call on the EVS system 10 to access the visualization information 107a of a particular model (step 1200). The EVS system 10 can call on the file handler module 210 of the visualization application 200 to access the visualization information file 107a. As discussed above, the visualization information file 107a can be stored on the mass storage device 104 or can be uploaded from an external file source.

Once the visualization data file 107a has been accessed, the ESV system 10 can then read the visualization data file 107a (step 1300). As discussed above, the ESV system 10 can call upon the visualization application file handler 210 to read the visualization data file 107a. When reading the visualization data file 107a, the file handler module 210 can evaluate the data file 107a for the individual model components found in the data file 107a. In an exemplary aspect, the file handler 210 can look to the visualization data file 107a to evaluate the individual components and identify global unique identifiers (GUIDs). Once read, the ESV system 10, through the visualization application file handler module 210, can record the visualization data file 107a to the system memory 112 (step 1400). In an aspect, as shown in FIG. 12A, the model identifier (3D_ID) associated with the visualization file 107a can be recorded as well (step 1400).

After recording the visualization data file 107a, the ESV system 10 can then access the spreadsheet data file 107b (step 1500). The EVS system 10 can call on the file handler module 3210 of the spreadsheet application 200 to access the spreadsheet information file 107b. As discussed above, the spreadsheet information file 107b can be stored on the mass storage device 104 or can be uploaded from an external file source.

Once the spreadsheet data file 107b has been accessed, the ESV system 10 can then read the spreadsheet visualization data file 107b (step 1600). As discussed above, the ESV system 10 can call upon the spreadsheet application file handler 310 to read the spreadsheet data file 107b. When reading the spreadsheet data file 107b, the file handler module 310 can evaluate the data file 107b for the individual model components found in the data file 107a, similar to the visualization application file handler 210. In an exemplary aspect, the spreadsheet application file handler 310 can look to the spreadsheet data file 107b to evaluate the individual components and identify their global unique identifiers, discussed in more detail below. Once read, the ESV system 10, through the spreadsheet application file handler module 310, can record the spreadsheet data file 107b to the system memory 112 (step 1700). In an aspect, the model identifier (SP_ID) associated with the spreadsheet file 107b can be recorded (step 1700) as illustrated in FIG. 12A. While the method 1000 discusses the visualization data file 107a being accessed, read, and recorded (step 1100-1400) before the spreadsheet data file 107b (step 1500-1700), it is understood that the accessing, reading, and recording of the spreadsheet data file 107b can occur before the same occurs to the visualization data file 107a according to another embodiment.

As discussed above, the ESV system 10 is configured to work with visualization files 107a and spreadsheet files 107b from a single model. If the user selects files 107a and 107b that contain data about different models, the ESV system 10 informs the stakeholder. As illustrated in FIGS. 12A-B, the ESV system 10 can determine whether or not files from different models have been provided by the user (method 2000). In an aspect, the ESV system 10 will compare the visualization data file 107a that has been recorded to the system memory 112 to the recorded spreadsheet data file 107b recorded to see if the files 107a, 107b are for the same model (step 2100). In an exemplary aspect, the ESV system 10 can compare the model IDs of each file 107a, 107b (3D_ID, SP_ID) to see if they are the same. If the ESV system 10 finds that the files 107a, 107b are for the same model, the ESV system 10 will call on both renderer modules 230, 330 to display both files (step 2200). If the ESV system 10 determines that the files 107a, 107b that have been recorded are not for the same model, the ESV system 10 can alert the user/stakeholder (step 2300). The alert can be in the form of displaying an error message. Once the user has been alerted, the ESV system 10 can prompt the user to return to the uploading of the correct files (step 1100).

As discussed above, once the files 107a, 107b have been loaded in computer memory and confirmed to be the same model, the ESV system 10 can then generate the combined views of the model. In an aspect, the ESV system 10 can call upon the visual renderer module 220 of the visualization application 200 to interpret the visualization information file 107a and generate a view of the model. Similarly, the ESV system 10 can call upon the visual renderer module 320 of the spreadsheet application 300 to interpret the spreadsheet data file 107b to generate the spreadsheet view of the model. Both views are displayed to the user on the same screen, as shown in FIGS. 3-4.

After a visual representation of the model view and spreadsheet view are made available, the user can interact with the ESV system 10 using various input devices, including, but not limited to, a keyboard, a mouse, a touch screen and the like. The user can choose to interact with either spreadsheet view or 3D view. Both scenarios have similar behavior in the context of this invention and are described in detailed in the following paragraphs. While the user can choose to interact with both views, that is interact with the 3D view and spreadsheet view, in a single usage session, it should be understood that since the user is a single entity, the user can only interact with one view at a time.

In general, the respective user input manager modules 230, 330 of the visualization application 200 and the spreadsheet application 300 monitor the interactions with each view. If the user input manager modules 230, 330 find that an action has been performed by the user to information displayed in their respective views, the user input manager modules 230, 330 will communicate with one another through their respective synchronization manager modules 240, 340 to make sure that a corresponding change or action occurs with the other view. In an aspect, the ESV system 10 utilizes the corresponding GUIDs to make sure that the simultaneous changes occur.

For example, if a user selects a specific cell or a group of cells to highlight in the spreadsheet view, the spreadsheet user input manager module 330 will notice the changed selection. For example, as shown in FIG. 3, some doors are selected in spreadsheet view and corresponding doors in 3D model are highlighted in 3D view. The input manager module 330 will identify the GUID(s) associated with cell or group of cells that have been selected. The input manager module 330 will call upon the visual renderer 320 to highlight the selected cells. In addition, the input manager module 330 will then pass along the GUIDs identified to the input manager module 230 of the visualization application 200 through the synchronization manager modules 240, 340. The input manager module 230 of the visualization application 200 will then use the GUIDs to identify the components of the model view, if any, that need to be selected as well. In an aspect, it should be noted that some components of the spreadsheet data files 107b may not have a corresponding component in the visualization data file 107a, as when the spreadsheet data file 107b contains information not relevant to the visualization file 107b, such as, but not limited to, cost or author information. Once it has been confirmed that there are corresponding components to the passed along GUIDS, these components of the visualization data file 107a are then selected in the model view by calling upon the visual renderer 220 to change/highlight such components.

Figure 14:
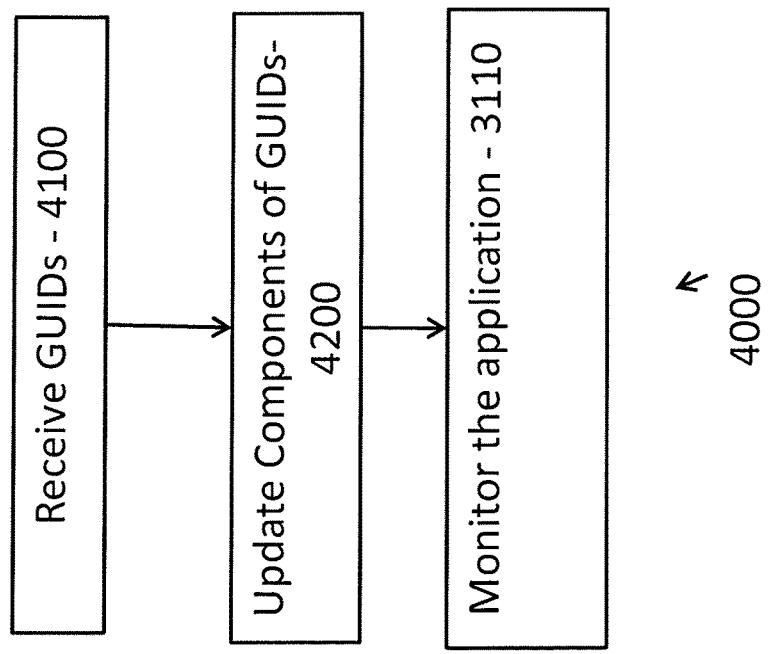
FIG. 14 is a flow chart depicting the updating of changes made by the ESV system according to an aspect of the present invention.
Figure 13:
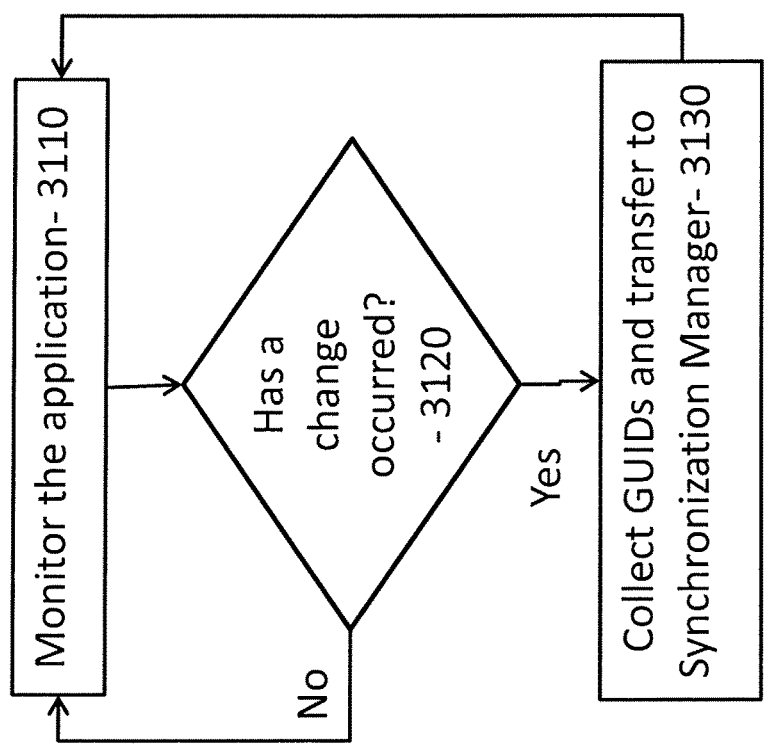
FIG. 13 is a flow chart depicting the monitoring of changes performed by the ESV system according to an aspect of the present invention.

FIGS. 13-14 illustrate an exemplary example of how the ESV system 10 can monitor the actions of the user with the different visualizations of the visualization file 107a and the spreadsheet file 107b (method 3000). As shown in FIG. 13, the visualization application 200 will monitor the visualization view 115a to see if the user has made any changes to the view (step 3110). In an aspect, the visualization application 200 will call upon the input manager module 230 to perform the monitoring. However, in other embodiments, other modules can be called upon to do such monitoring.

The input manager module 230 will constantly scan for user input form the input devices. The visualization application 200 will then determine if a change has been made (step 3120). The input manager module 230 can compare previous selections or actions performed to determine if a change has occurred. If the visualization application 200 determines that no change has been made, the visualization application 200 does nothing, and returns to monitoring the model view (step 3110). If the visualization application 200 determines that a change has occurred, the visualization application 200 will then collect the GUIDs of the components for which a change has been detected and send them to the spreadsheet application 300 (step 3130). As discussed above, if input manager module 230 is utilized for the monitoring, the input manager module 230 will call upon the file handler module 210 to retrieve the needed GUIDs, and then pass along such GUIDs to the synchronization manager module 240 of the visualization application 200 to pass along to the synchronization manager module 340 of the spreadsheet application 300. Once the information has been passed along, the visualization application 200 will return to monitoring view (step 3110).

Figure 15:
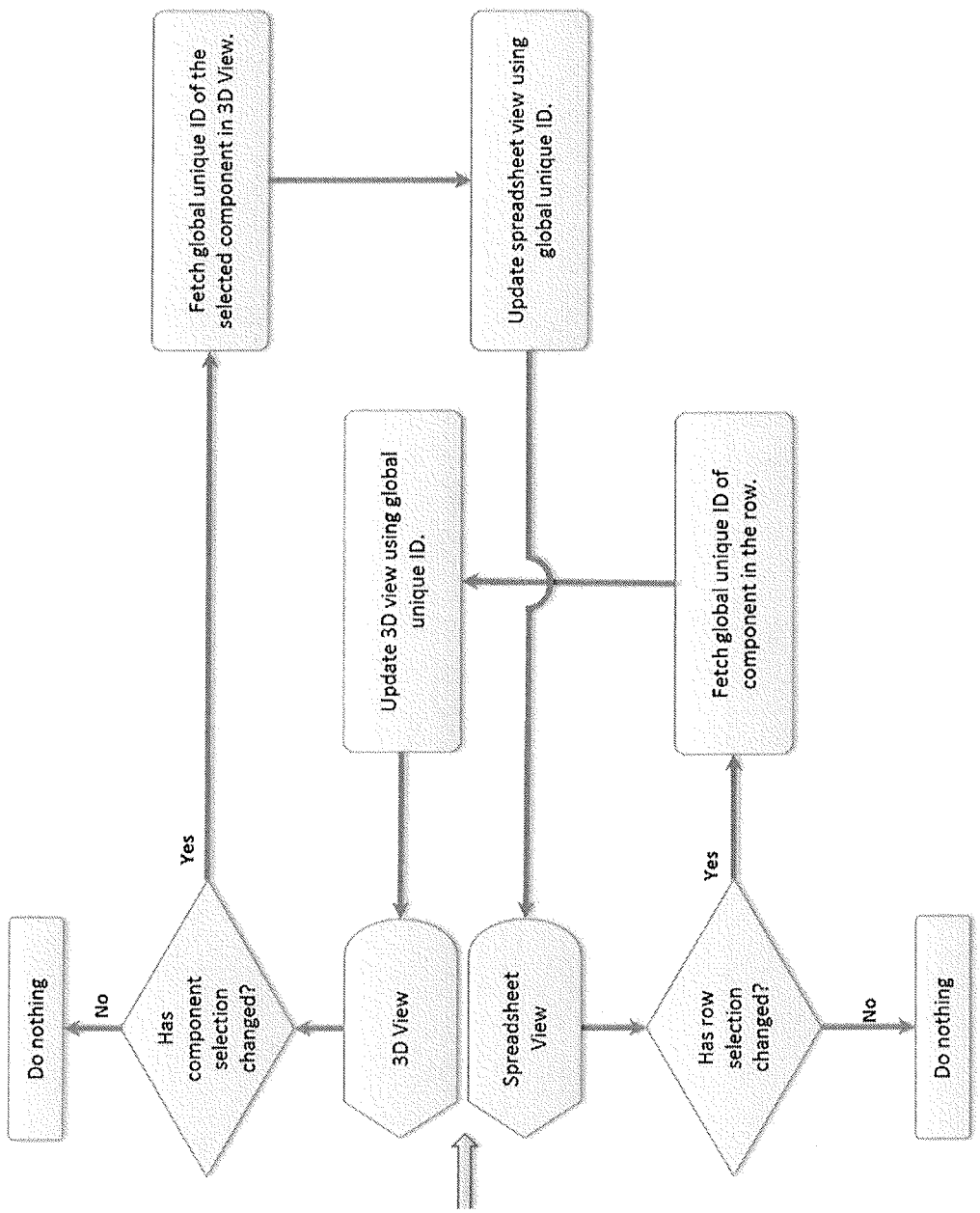
FIG. 15 is a flow chart depicting how the synchronization happens between the visualization application and spreadsheet application of the ESV system according to an aspect.

FIG. 14 shows a method of receiving and updated the information (method 4000) according to an aspect. When the spreadsheet application 300 receives the GUIDs from the visualization application 200 (step 4100), the spreadsheet application 300 will then update the spreadsheet components that match the GUIDs provided by the visualization application (step 4200). In an aspect, the synchronization manager module 340 of the spreadsheet application 300 will pass along the GUIDs to the input manager module 330, which can then direct the visual render 320 to change the view of the corresponding GUIDs on the spreadsheet view. Once the spreadsheet application 300 has updated the components, the spreadsheet application 300 can return to monitoring to see if the user makes any changes to the spreadsheet components directly. In an aspect, similar to the visualization application 200, the spreadsheet application 300 can call on the input manager module 330 to continuously monitor. While the methods (3000 and 4000) have been discussed in terms of the visualization application 200 discovering a change occurring and then notifying the spreadsheet application 300 for the spreadsheet application 300 to make changes, it is understood that the spreadsheet application 200 can also monitor and notify the visualization application 300 that changes have occurred as well. Therefore, it should be understood that both the methods 3000 and 4000 illustrated in FIGS. 13 and 14 can be performed by both the spreadsheet application 300 and the visualization application 200, and are not exclusive to either application. In addition, the modules of the visualization application 200 can perform the same actions and have the same responsibilities as the corresponding modules of the spreadsheet application 300, and vice versa, as discussed above. To further this, FIG. 15 depicts a flow chart of how both the visualization application 200 and the spreadsheet application 300 can work together to monitor and maintain the changes that are occurring on the ESV system 10.

In an aspect, the ESV system 10 can be configured to update simultaneously changes made to the information in both the visualization data files 107*a* and the spreadsheet data files 107*b* when such changes are made to one or the other. For example, when the input manager module 230 of the visualization application 200 becomes aware of a change to a value, the input manager module 230 can direct the file handler 210 of the visualization application 200 to update the information in the visualization data file 107*a*. At the same time, the input manager module 230 of the visualization application 200 can call on the visual renderer 220 to change the presentation of the view of the information in the model view.

Once the information has been changed on the visualization application 200, the input manager module 230 can capture the information that has changed and pass along the information, as well as the GUID(s) that identifies the component for which the value has changed, to the input manager module 330 of the spreadsheet application 300 via the synchronization manager modules 240, 340. Upon receiving the information from the visualization application 200, the input manager module 330 of the spreadsheet application 300 can call upon the file handler module 330 to update the corresponding spreadsheet data information 107*b*. At the same time, the input manager module 330 can call upon the visual renderer module 320 to change the visual presentation of the spreadsheet information accordingly. While the above updating information above has been discussed only in terms of new information being discovered in the visualization application 200, the spreadsheet application 300 is also configured to provide the same type of updating assistance to the visualization application 200 when such changes are initiated to components of the spreadsheet views and data.

Having thus described exemplary embodiments of the present invention, those skilled in the art will appreciate that the within disclosures are exemplary only and that various other alternatives, adaptations, and modifications may be made within the scope of the present invention. Accordingly, the present invention is not limited to the specific embodiments as illustrated herein, but is only limited by the following claims.

What is claimed is:

1. An express spreadsheet visualization system configured for the simultaneous viewing of spreadsheet information and visualization information of a model, comprising;
   a. a processor;
   b. a display device;
   c. an input interface configured for use by the user; and
   d. a system memory comprising;
      i. a visualization application configured to show the visualization information for the model to a user on the display device;
      ii. a spreadsheet application configured to show the spreadsheet information of the model to the user on the display device, wherein the spreadsheet application is configured to allow, through the input interface, the user to make changes to components of the spreadsheet information, the spread sheet application comprising: an input manager module to monitor and interpret the changes made to the spreadsheet information by the user; and a synchronization module configured to pass along the changes made to the spreadsheet information to the visualization application, wherein the visualization application and the spreadsheet application are configured to show the visualization information and the spreadsheet information of the model on the display device simultaneously, wherein the spreadsheet application and the visualization application are configured to work with one another to synchronize the visualization information and the spreadsheet information in real-time, wherein the spreadsheet application is configured to continuously monitor the spreadsheet information and notify the spreadsheet application of changes made to the spreadsheet information; and wherein the input manager module is further configured to identify a global unique identifier of each component for which the user has changed, wherein the synchronization module is further configured to pass along the global unique identifiers to the visualization application, and wherein the visualization application is further configured to make changes to the corresponding components that match the global unique identifiers.

2. The express spreadsheet visualization system of claim 1, wherein the visualization application is configured to continuously monitor the visualization information and notify the spreadsheet application of changes made to the visualization information.

3. The express spreadsheet visualization system of claim 2, further comprising a input interface configured to allow the user to make changes to components of the visualization information, wherein the visualization application further comprises:
   an input manager module configured to monitor and interpret the changes made to the visualization information by the user; and
   a synchronization module configured to pass along the changes made to the visualization information to the spreadsheet application.

4. The express spreadsheet visualization system of claim 3, wherein the input manager module is further configured to identify a global unique identifier of each component for which the user has changed, wherein the synchronization module is further configured to pass along the global unique identifiers to the spreadsheet application, and wherein the spreadsheet application is further configured to make changes to the corresponding components that match the global unique identifiers.

5. The express spreadsheet visualization system of claim 1, wherein the spreadsheet application and the visualization application each further comprise a file handler module configured to transfer the spreadsheet information and the visualization information to the system memory.

6. The express spreadsheet visualization system of claim 5, wherein the express spreadsheet visualization system is further configured to notify a user when the spreadsheet information and the visualization information that the user has selected are not for the same model.

7. The express spreadsheet visualization system of claim 1, wherein the model is a BIM model.

8. The express spreadsheet visualization system of claim 1, wherein the change comprises the selection of a component of the visualization information or the spreadsheet information.

9. The express spreadsheet visualization system of claim 1, wherein the change comprises modifying a component of the visualization information or the spreadsheet information.

10. An express spreadsheet visualization system comprising:
   a. a processor;
   b. a display device;
   c. a user input device configured to intake inputs from a user;
   d. a system memory comprising;
      i. a visualization application configured to utilize the visualization information; and
      ii. a spreadsheet application configured to utilize the spreadsheet information, wherein each of the visualization application and spreadsheet application further comprises:
         A. a file handler module configured to transfer the respective visualization information or the spreadsheet information;
         B. a visual renderer module configured to display the respective visualization information or the spreadsheet information on the display device;
         C. a synchronization module, wherein the synchronization modules of the visualization application and the spreadsheet application are configured to communicate with one another; and
         D. an input manager module, wherein the input manger module is configured to capture the inputs of the user in relation to the visualization information or the spreadsheet information displayed on the display device, determine whether changes have been made to the visualization information or the spreadsheet information based upon the inputs, and communicate the changes to the visualization information to the spreadsheet application and the changes to the spreadsheet information to the visualization through the synchronization modules, and wherein the input manager module is further configured to take the changes received by the synchronization module and implement the changes to corresponding components of the spreadsheet information or the visualization information and call on the visual render module to display the changes and the file handler module to make the changes to the visualization information and spreadsheet information on the system memory.

11. A computer-implemented method for simultaneous viewing of spreadsheet information and visualization information of a model on a display device by a user, comprising:
   a. displaying the spreadsheet information on the display device by:
      i. accessing the spreadsheet information;
      ii. recording the spreadsheet information to a system memory; and
      iii. displaying the spreadsheet information on a display device;
   b. displaying the visualization information on the display device with the spreadsheet information by:
      i. accessing the visualization information;
      ii. recording the visualization information to a system memory; and
      iii. displaying the visualization information on a display device;
   c. monitoring changes by the user to the visualization information or to the spreadsheet information;
   d. modifying the spreadsheet information or the visualization information to correspond to the changes made to the visualization information or the spreadsheet information; and
   e. displaying the modified spreadsheet information or the modified visualization information simultaneously on the display device as the changes are made to the visualization information or the spreadsheet information.

12. The method of claim 11, further comprising the step of confirming the spreadsheet information and the visualization information are for the same model, wherein the confirming step happens before displaying the spreadsheet information.

* * * * *